United States Patent [19]

Uetani et al.

[11] Patent Number: 5,059,507
[45] Date of Patent: Oct. 22, 1991

[54] POSITIVE RESIST COMPOSITION CONTAINING QUINONE DIAZIDE SULFONIC ACID ESTER OF A PHENOL COMPOUND AND AN ALKALI SOLUBLE RESIN

[75] Inventors: Yasunori Uetani, Minoo; Makoto Hanabata, Hyogo; Hirotoshi Nakanishi, Osaka; Koji Kuwana, Fujiidera; Yukio Hanamoto, Toyonaka; Fumio Oi, Ashiya, all of Japan

[73] Assignee: Sumitomo Chemical Company, Limited, Osaka, Japan

[21] Appl. No.: 364,123

[22] Filed: Jun. 12, 1989

[30] Foreign Application Priority Data

Jun. 13, 1988 [JP] Japan ................................. 63-146498

[51] Int. Cl.$^5$ ............................................. G03C 1/52
[52] U.S. Cl. ..................................... 430/192; 430/193; 534/557
[58] Field of Search ................. 430/192, 193; 534/557

[56] References Cited

U.S. PATENT DOCUMENTS 3,046,118  7/1962  Schmidt ............................. 430/193
3,046,119  7/1962  Sus ..................................... 430/193
4,883,739  11/1989  Sakaguchi et al. ................ 430/193

Primary Examiner—Charles L. Bowers, Jr.
Assistant Examiner—John S. Y. Chu
Attorney, Agent, or Firm—Birch, Stewart, Kolasch & Birch

[57] ABSTRACT

A quinone diazide sulfonic acid ester of a phenol compound of the general formula (I):

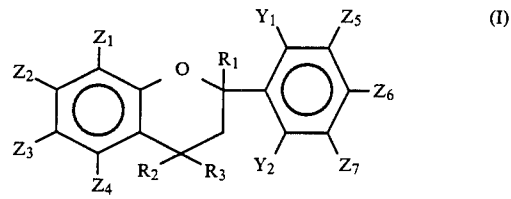

wherein $Y_1$ and $Y_2$ are each a hydrogen atom, an alkyl group or a hydroxyl group, provided that at least one of $Y_1$ and $Y_2$ is a hydroxyl group; $Z_1$, $Z_2$, $Z_3$, $Z_4$, $Z_5$, $Z_6$ and $Z_7$ are the same or different and each a hydrogen atom, a hydroxyl group, an alkyl group, a cycloalkyl group, an aryl group or halogen atom, provided that at least two of $Z_1$, $Z_2$, $Z_3$, $Z_4$, $Z_5$, $Z_6$ and $Z_7$ are hydroxyl groups; $R_1$, $R_2$ and $R_3$ are the same or different and each a hydrogen atom, an alkyl group, an alkenyl group, a cycloalkyl group or an aryl group provides a positive resist composition having a high $\gamma$-value.

20 Claims, 2 Drawing Sheets

POSITIVE RESIST COMPOSITION CONTAINING QUINONE DIAZIDE SULFONIC ACID ESTER OF A PHENOL COMPOUND AND AN ALKALI SOLUBLE RESIN

BACKGROUND OF THE INVENTION

1. Field of the Invention

The present invention relates to a resist composition which comprises a sensitizer and is sensitive to ultraviolet rays (G-line, H-line, I-line and so on), far ultraviolet rays (excimer laser and so on), electron rays and radioactive rays such as X rays, a novel phenol compound, a quinone diazide sulfonic acid ester of said novel phenol compound and also a sensitizer to be used in a positive resist composition.

2. Description of the Related Art

A composition containing a compound having a quinone diazide group such as a naphthoquinone diazide group, a benzoquinone diazide group, etc. and an alkali-soluble resin finds use as a positive resist, because upon exposure to ultraviolet rays, the quinone diazide group decomposes to form a carboxyl group whereby the originally alkali-insoluble composition becomes alkali-soluble. A condensation product of a phenol compound (e.g. trihydroxybenzophenone, tetrahydroxybenzophenone and so on) with a quinone diazide compound is used as a sensitizer.

However, particularly with integrated circuits, miniaturization has proceeded with a rise in the integration level, which results in demands for formation on the patterns of submicron order and more excellent resolution (high $\gamma$-value). As a result, the conventional compositions cannot improve the $\gamma$-value to the desired level.

For example, if the amount of quinone diazide group is increased to improve the $\gamma$-value, serious problems such as deterioration of sensitivity and increase of residues after developing arise.

SUMMARY OF THE INVENTION

One object of the present invention is to provide a positive resist composition which has the high $\gamma$-value and can overcome the problems associated with the conventional positive resist compositions.

Another object of the present invention is to provide a sensitizer consisting of a quinone diazide sulfonic acid ester of a phenol compound, which sensitizer is used in a positive resist composition.

Accordingly, the present invention provides a positive resist composition which comprises an alkali-soluble resin and at least one quinone diazide sulfonic acid ester of a phenol compound of the general formula (I):

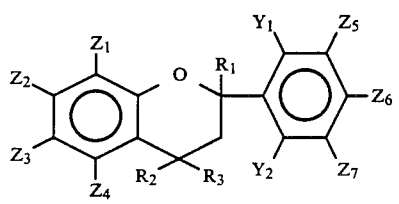

wherein $Y_1$ and $Y_2$ are each a hydrogen atom, an alkyl group or a hydroxyl group, provided that at least one of $Y_1$ and $Y_2$ is a hydroxyl group; $Z_1$, $Z_2$, $Z_3$, $Z_4$, $Z_5$, $Z_6$ and $Z_7$ are the same or different and each a hydrogen atom, a hydroxyl group, an alkyl group, a cycloalkyl group, an aryl group or halogen atom, provided that at least two of $Z_1$, $Z_2$, $Z_3$, $Z_4$, $Z_5$, $Z_6$ and $Z_7$ are hydroxyl groups; $R_1$, $R_2$ and $R_3$ are the same or different and each a hydrogen atom, an alkyl group, an alkenyl group, a cycloalkyl group or an aryl group.

DETAILED DESCRIPTION OF THE INVENTION

Figure 1:
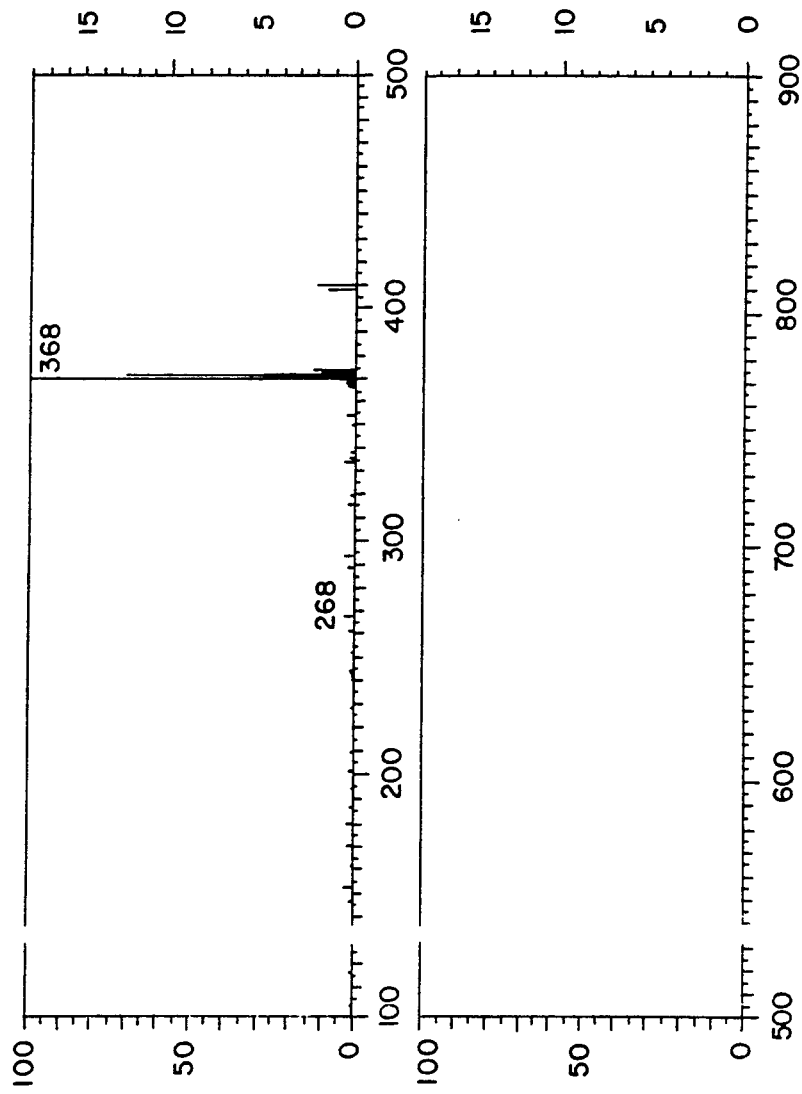
FIG. 1 is a mass spectrum of the compound obtained in Synthetic Example 1.
Figure 2:
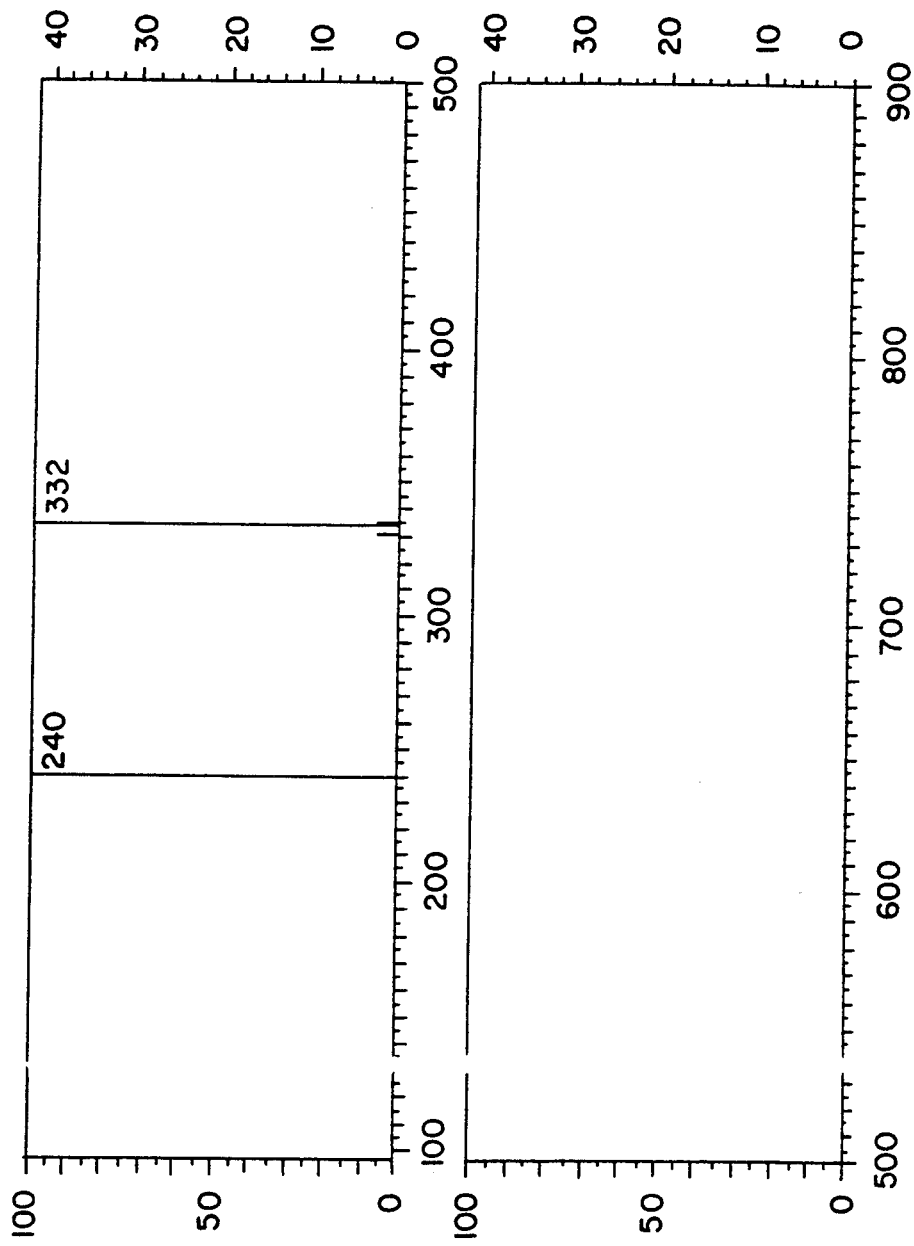
FIG. 2 is a mass spectrum of the compound obtained in Synthetic Example 2.

Among the compounds (I) in which the number of the group(s) of $Z_1$, $Z_2$, $Z_3$, $Z_4$, $Z_5$, $Z_6$ and $Z_7$ are the same, the compound (I) in which all of the rest of $Z_1$, $Z_2$, $Z_3$, $Z_4$, $Z_5$, $Z_6$ and $Z_7$ are or is hydrogen atoms is preferred in comparison with the compound (I) in which one or more of the rest of $Z_1$, $Z_2$, $Z_3$, $Z_4$, $Z_5$, $Z_6$ and $Z_7$ is not a hydrogen atom.

Preferably, two of them are hydroxyl groups because of a higher $\gamma$-value of the produced resist. Also preferably, at least one of $Z_1$, $Z_2$, $Z_3$ and $Z_4$ is a hydroxyl group and at least one of $Z_5$, $Z_6$ and $Z_7$ is a hydroxyl group because of a higher film thickness retention. More preferably, $Y_2$, $Z_2$ and $Z_6$ are hydroxyl groups.

Preferably, $R_1$, $R_2$ and $R_3$ is a $C_1$-$C_4$ alkyl group, particularly methyl or ethyl.

Examples of the phenol compound of the formula (I) include

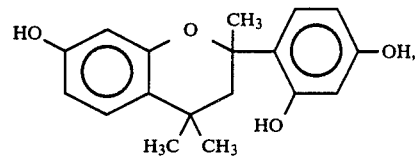

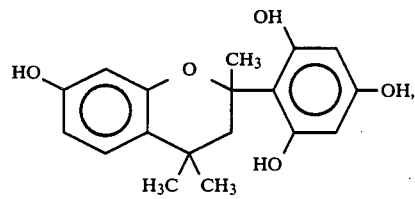

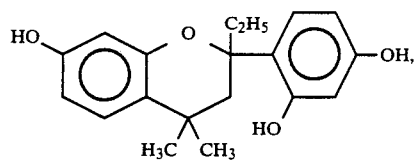

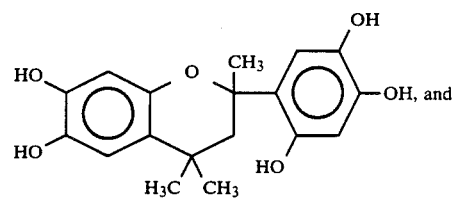

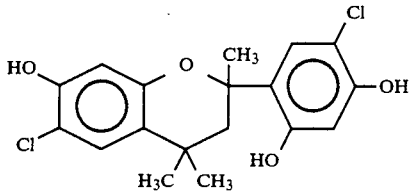

The quinone diazide sulfonic acid ester of the phenol compound (I) may be prepared by a per se conventional method. For example, the ester is prepared by a condensation reaction of the phenol compound with naphthoquinone diazide sulfonyl halogenide or benzoquinone diazide sulfonyl halogenide in the presence of a weak alkali such as sodium carbonate.

The quinone diazide sulfonic acid ester of the phenol compound (I) according to the present invention is particularly useful as a sensitizer to be used in a positive resist composition.

The positive resist composition of the present invention may contain two or more quinone diazide sulfonic acid esters of the phenol compound (I) in combination. The resist composition of the present invention may optionally include at least one ester of a phenol compound other than the phenol compound of the general formula (I).

Examples of the other phenol compound are hydroquinone, resorcinol, phloroglucin, 2,4-dihydroxybenzophenone, 2,3,4-trihydroxybenzophenone, tetrahydroxybenzophenones such as 2,3,3',4-tetrahydroxybenzophenone, 2,3,4,4,'-tetrahydroxybenzophenone and 2,2',4,4'-tetrahydroxybenzophenone, pentahydroxybenzophenones such as 2,2',3,3',4-pentahydroxybenzophenone and 2,3,3',4,5'-pentahydroxybenzophenone, bis[(poly)hydroxyphenyl]alkanes such as 2,2-bis(2,4-dihydroxyphenyl)propane, 2-[(poly)hydroxyphenyl]-2-[(poly)hydroxyphenyl]alkanes such as 2-(3-hydroxyphenyl)-2-(2,5-dihydroxyphenyl)propane, alkyl gallates, and the like.

A novolak resin is preferably used as the alkali-soluble resin. The novolak resin is prepared by an addition condensation reaction of a phenol with formaldehyde. Specific examples of the phenol used as one of the raw materials for the novolak resin include phenol, cresol, xylenol, ethylphenol, trimethylphenol, propylphenol, butylphenol, dihydroxybenzene, naphthols, etc. These phenols may be used alone or in combination.

The formaldehyde which undergoes the addition condensation reaction with the phenol can be used in the form of an aqueous solution of formaldehyde (formalin) or paraformaldehyde which is an oligomer of formaldehyde. Particularly, 37% formalin which is commercially mass produced is suitably used.

The addition condensation reaction of the phenol with formaldehyde can be carried out according to the usual method. This reaction is carried out at a temperature of from 60° to 120° C. for 2 to 30 hours. Organic acids, inorganic acids or divalent metal salts are used as catalysts. Specifically, exemplified are oxalic acid, hydrochloric acid, sulfuric acid, perchloric acid, p-toluenesulfonic acid, trichloroacetic acid, phosphoric acid, formic acid, zinc acetate, magnesium acetate, etc.

The reaction may be carried out in the presence or absence of a solvent.

The amount of the quinone diazide sulfonic acid ester to be added to the resist composition is from 10 to 50% by weight based on the total weight of the solid components in the resist composition.

The amount of the alkali-soluble resin to be added to the resist composition is not less than 30% by weight based on the total weight of the solid components in the resist composition.

The positive photoresist is prepared by mixing and dissolving the foregoing quinone diazide compound and the alkali-soluble resin in a solvent. Preferably, the used solvent evaporates at a suitable drying rate to give a uniform and smooth coating film. Such the solvent includes ethylcellosolve acetate, methylcellosolve acetate, ethylcellosolve, methylcellosolve, propylene glycol monomethyl ether acetate, butyl acetate, methyl isobutyl ketone, xylene, etc. To the positive photoresist composition obtained by the foregoing method, small amounts of resins, dyes, etc. may be added if desired.

With the resist composition of the present invention, the γ-value can be improved and the problems associated with increase of developing remains can be solved.

PREFERRED EMBODIMENTS OF THE INVENTION

The present invention will be illustrated more in detail with the following Examples, but it is not limited to these Examples. In Examples, "parts" are by weight.

Synthetic Example 1

To 100 g of 20% hydrochloric acid, 14.5 g of 4-chlororesorcinol was added and heated to 50°-60° C. while stirring to obtain a homogeneous solution. To the solution, 3.8 g of acetone was dropwise added over 15 minutes followed by stirring for further 20 hours. During the reaction, the temperature was kept at 50°-60° C.

The resulting solution was cooled down to room temperature, and decanted. Then, 200 g of water was added to the solution and stirred for 1 hour. The solution was again decanted at room temperature to obtain an oily compound.

The oily compound was extracted with 50 g of ethyl acetate. Then, the ethyl acetate layer was washed twice with 50 g of water and concentrated to obtain an oily compound. To 7.5 g of the oily compound, 15 g of toluene and 5 g of hexane were added. Thereafter, the resulting solution was cooled with ice for recrystallization, filtered and dried to obtain 3.5 g of the compound of the formula (1):

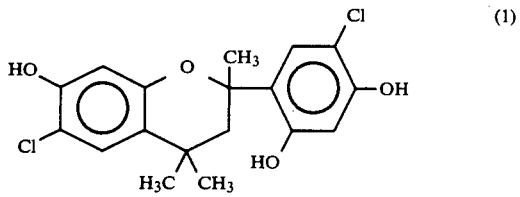

Synthetic Example 2

To 150 g of 40% sulfuric acid, 15.7 g of 1,2,4-trihydroxybenzene was added and heated to 20°-30° C. while stirring to obtain a homogeneous solution. To the solution, 2.5 g of acetone was dropwise added over 10 minutes followed by stirring for further 14 hours. The resulting solution was filtered to obtain a mass.

The mass was washed with 500 g of water three times at the temperature kept at 70° C. and dried to obtain a wet cake. Five grams of the wet cake was washed with 15 g of ethyl acetate three times and dried to obtain 3.5 g of the compound of the formula (2):

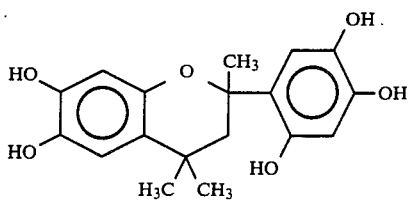

MS: m/e = 332 (M+)

Reference Example 1

(Synthesis of the sensitizer A)

In a 300 ml three-necked flask, 6.00 g of the below compound (3) obtained in Example 1 in Japanese Patent Kokai Publication No. 139375/1980, 13.98 g of naphthoquinone-(1,2)-diazide-(2)-5-sulfonyl chloride (in the molar ratio of 1:2.6) and 200 g of dioxane were charged and stirred to achieve complete dissolution. 5.79 Grams of triethylamine was dropwise added over 30 minutes while stirring on a water bath to keep the reaction temperature at 20°-25° C. Reaction was carried out with stirring for further 4 hours at 20°-25° C. The reaction solution was then charged into ion-exchanged water, filtered and dried to obtain a sensitizer, which is referred to as sensitizer A.

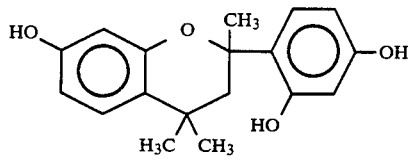

Reference Example 2

(Synthesis of the sensitizer B)

The same procedures as in Reference Example 1 were repeated, except that the compound (1) obtained in Synthetic Example 1 was used instead of the compound (3), to obtain a sensitizer, which is referred to as sensitizer B.

Reference Example 3

(Synthesis of the sensitizer C)

The same procedures as in Reference Example 1 were repeated, except that the compound (2) obtained in Synthetic Example 2 (in the molar ratio to naphthoquinone-(1,2)-diazide-(2)-5-sulfonyl chloride of 1:4) was used instead of the compound (3), to obtain a sensitizer, which is referred to as sensitizer C.

Reference Examples 4 and 5

(Synthesis of the sensitizers D and E)

The same procedures as in Reference Example 1 were repeated, except that 2,2',4-trihydroxybenzophenone (for the sensitizer D) or 2,3,4-trihydroxybenzophenone (for the sensitizer E) was used instead of the compound (3), to obtain a sensitizer, which is referred to as sensitizer D or E.

Examples 1-3 and Comparative Examples 1-2

The sensitizer A, B, C, D or E obtained in Reference Examples 1-5 and a novolak resin in amounts shown in Table 1 were dissolved in 48 parts of ethyl cellosolve acetate to prepare a resist solution, which was filtered through a Teflon (trade mark) filter of 0.2 μm in pore size. The resist solution was coated on a silicon wafer, which had been rinsed in a usual manner, by means of a spinner so as to form a resist film of 1.3 μm in thickness. Subsequently, the silicon wafer was baked for 60 seconds on a hot plate kept at 100° C., and exposed to light while varying the exposure value stepwise by means of a reduction projection exposing apparatus (DSW 4800 with NA=0.28 manufactured by GCA) in having a wavelength of 436 nm. Thereafter, the silicon wafer was developed for 1 minute in a developing solution (SOPD manufactured by Sumitomo Chemical Company, Limited) to obtain a positive pattern. The γ-value is expressed in terms of tan θ the angle θ of which is obtained by plotting the rate of the standardized film thickness (=the retained film thickness/the original film thickness) against the exposure value and calculating the inclination of the plotted line. The γ-value and the resolution which was obtained at the same time are shown in Table 1.

TABLE 1

| | Resist Components | | |
| --- | --- | --- | --- |
| | Novolak Resin*[1] (parts) | Sensitizer (parts) | γ-Value |
| Example 1 | 17 | A, 5 | 4.3 |
| Example 2 | 17 | B, 5 | 3.3 |
| Example 3 | 17 | C, 5 | 3.2 |
| Comp. Example 1 | 17 | D, 5 | 2.6 |
| Comp. Example 2 | 17 | E, 5 | 2.5 |

Note: *[1])Novolak Resin A cresol mixture (the molar ratio of m-isomer to p-isomer: 7/3) was reacted with formalin (the molar ratio of formalin to cresol, 1/0.8) using oxalic acid as a catalyst under reflux to obtain a novolak resin of 9800 in weight average molecular weight calculated as polystrene.

What is claimed is:

1. A positive resist composition which in admixture comprises an alkali-soluble resin and one or more naphthoquinone or benzoquinone diazide sulfonic acid esters of a phenol compound of the general formula:

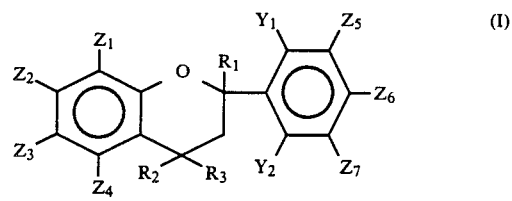

wherein $Y_1$ and $Y_2$ are each a hydrogen atom, an alkyl group or a hydroxyl group, provided that at least one of $Y_1$ and $Y_2$ is a hydroxyl group; $Z_1$, $Z_2$, $Z_3$, $Z_5$, $Z_6$ and $Z_7$ are the same or different and each of a hydrogen atom, a hydroxyl group, an alkyl group, a cycloalkyl group, an aryl group or halogen atom, provided that at least two of $Z_1$, $Z_2$, $Z_3$, $Z_4$, $Z_5$, $Z_6$ and $Z_7$ are hydroxyl groups; $R_1$, $R_2$ and $R_3$ are the same or different and each a hydrogen atom, an alkyl group, an alkenyl group, a cycloalkyl group or an aryl group, wherein said alkali-soluble resin is present in an amount of not less than 305 by weight and said quinone diazide sulfonic acid ester of said phenol compound is present in an amount of from 10 to 50% by weight based on the total weight of the solid components in the resist composition.

2. The positive resist composition according to claim 1, wherein two of $Z_1$, $Z_2$, $Z_3$, $Z_4$, $Z_5$, $Z_6$ and $Z_7$ are hydroxyl groups.

3. The positive resist composition according to claim 1, wherein at least one of $Z_1$, $Z_2$, $Z_3$ and $Z_4$ is a hydroxyl group and at least one of $Z_5$, $Z_6$ and $Z_7$ is a hydroxyl group.

4. The positive resist composition according to claim 1, wherein $Y_2$, $Z_2$ and $Z_6$ are hydroxyl groups.

5. The positive resist composition according to claim 1, wherein $R_1$, $R_2$ and $R_3$ are each a $C_1$-$C_4$ alkyl group.

6. The positive resist composition according to claim 2, wherein $R_1$, $R_2$ and $R_3$ are each a $C_1$-$C_4$ alkyl group.

7. The positive resist composition according to claim 3, wherein $R_1$, $R_2$ and $R_3$ are each $C_1$-$C_4$ alkyl group.

8. The positive resist composition according to claim 4, wherein $R_1$, $R_2$ and $R_3$ are each a $C_1$-$C_4$ alkyl group.

9. The positive resist composition according to claim 1, wherein $R_1$, $R_2$ and $R_3$ are each a methyl or ethyl group.

10. The positive resist composition according to claim 2, wherein $R_1$, $R_2$ and $R_3$ are each a methyl or ethyl group.

11. The positive resist composition according to claim 3, wherein $R_1$, $R_2$ and $R_3$ are each a methyl or ethyl group.

12. The positive resist composition according to claim 4, wherein $R_1$, $R_2$ and $R_3$ are each a methyl or ethyl group.

13. The positive resist composition according to claim 1, wherein the phenol compound of formula (I) is

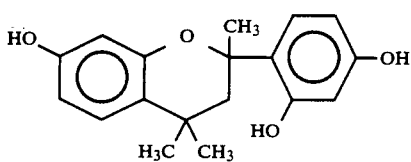

14. The positive resist composition according to claim 1, wherein the phenol compound of formula (I) is

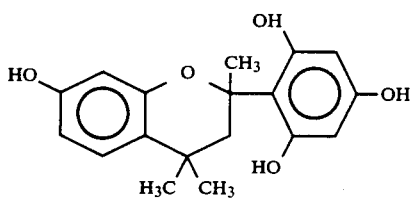

15. The positive resist composition according to claim 1, wherein the phenol compound of formula (I) is

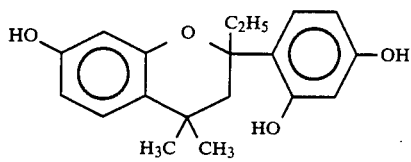

16. The positive resist composition according to claim 1, wherein the phenol compound of formula (I) is

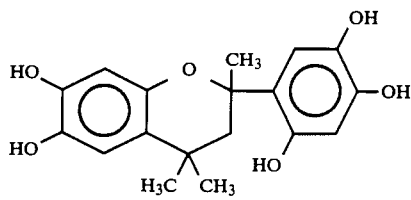

17. The positive resist composition according to claim 1, wherein the phenol compound of formula (I) is

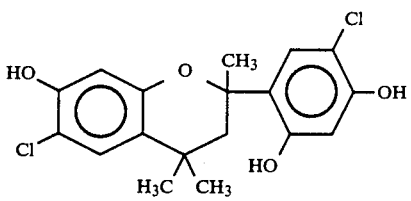

18. The positive resist composition according to claim 1, further comprising a quinone diazide sulfonic acid ester of a phenol compound selected from the group consisting of hydroquinone, resorcinol, phloroglucin, 2,4-dihydroxybenzophenone, 2,3,4-trihydroxybenzophenone, 2,3,3',4-tetrahydroxybenzophenone, 2,3,4,4'-tetrahydroxybenzophenone, 2,2',4,4',-tetrahydroxybenzophenone, 2,2',3,3',4-pentahydroxybenzophenone, 2,3,3',4,5'-pentahydroxybenzophenone, 2,2-bis(2,4-dihydroxyphenol)propane, 2-(3-hydroxyphenyl)-2-(2,5-dihydroxyphenyl)propane and alkyl gallates.

19. The positive resist composition according to claim 1, wherein said alkali-soluble resin comprises a novolak resin prepared by an addition condensation reaction of a phenol with formaldehyde.

20. A positive resist composition which comprises a novolak resin and one or more naphthoquinone or benzoquinone diazide sulfonic acid esters of a phenol compound of the general formula (I):

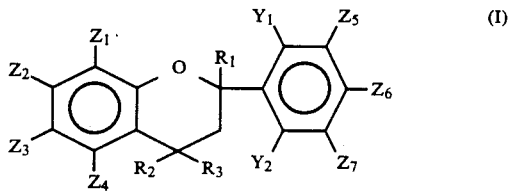

wherein $Y_1$ and $Y_2$ are each a hydrogen atom or a hydroxyl group, provided that at least one of $Y_1$ and $Y_2$ is a hydroxyl group; $Z_1$, $Z_2$, $Z_3$, $Z_4$, $Z_5$, $Z_6$ and $Z_7$ are the same or different and each a hydrogen atom or a hydroxyl group, provided that at least two of $Z_1$, $Z_2$, $Z_3$, $Z_4$, $Z_5$, $Z_6$ and $Z_7$ are hydroxyl groups; and $R_1$, $R_2$ and $R_3$ are the same or different and each a hydrogen atom, an alkyl group, an alkenyl group, a cycloalkyl group or an aryl group, wherein said alkali-soluble resin is present in an amount of not less than 30% by weight and said quinone diazide sulfonic acid ester of said phenol compound is present in an amount of from 10 to 50% by weight based on the total weight of the solid components in the resist composition.

* * * * *